(12) United States Patent
Niwa

(10) Patent No.: US 6,259,154 B1
(45) Date of Patent: Jul. 10, 2001

(54) SEMICONDUCTOR DEVICE AND METHOD OF MANUFACTURING THE SAME

(75) Inventor: Koichiro Niwa, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/294,969

(22) Filed: Apr. 20, 1999

(30) Foreign Application Priority Data

Apr. 21, 1998 (JP) .................................................. 10-110667

(51) Int. Cl.⁷ .................................................. H01L 23/02
(52) U.S. Cl. .......................... 257/678; 257/778; 257/787; 257/788
(58) Field of Search .................................. 257/678, 778, 257/779, 787, 788, 790, 798

(56) References Cited

U.S. PATENT DOCUMENTS

| | | | |
|---|---|---|---|
| 5,525,834 | * 6/1996 | Fischer et al. | 257/691 |
| 5,612,576 | * 3/1997 | Wilson et al. | 257/788 |
| 5,835,355 | * 11/1998 | Dordi | 361/760 |
| 5,841,194 | * 11/1998 | Tsukamoto | 257/729 |
| 5,939,778 | * 8/1999 | Boutin et al. | 257/678 |
| 6,002,171 | * 12/1999 | Desai et al. | 257/707 |
| 6,166,434 | * 12/2000 | Desai et al. | 257/704 |

FOREIGN PATENT DOCUMENTS

| | | |
|---|---|---|
| 45-36771 | 11/1970 | (JP). |
| 4-167452 | 6/1992 | (JP). |
| 9-246315 | 9/1997 | (JP). |

OTHER PUBLICATIONS

Tummala R.R., Rymaszewski E.J., Klopfenstein A.G., "Microelectronic Packaging Handbook, Semiconductor Packaging, Part II", second edition, pp. 222, 223,244, 258, and 259, 1997.*

* cited by examiner

Primary Examiner—Matthew Smith
Assistant Examiner—Renzo N. Rocchegiani
(74) Attorney, Agent, or Firm—Hayes, Soloway, Hennessey, Grossman & Hage, PC

(57) ABSTRACT

A semiconductor device includes a semiconductor chip, a TAB tape, a stiffener, and a heat dissipation plate. The TAB tape has inner leads to be connected to electrodes of the semiconductor chip. The stiffener is adhered to the lower surface of the TAB tape to maintain flatness of the TAB tape. The heat dissipation plate has a surface on which the semiconductor chip and the stiffener surrounding the semiconductor chip are adhered. The heat dissipation plate dissipates heat generated by the semiconductor chip. The stiffener is molded with a synthetic resin material. A method of manufacturing a semiconductor device is also disclosed.

7 Claims, 10 Drawing Sheets

PRESSURIZATION

PRODUCT

SEMICONDUCTOR DEVICE AND METHOD OF MANUFACTURING THE SAME

BACKGROUND OF THE INVENTION

The present invention relates to a BGA (Ball Grid Array) package-type semiconductor device using a TAB (TApe Bonding) tape and a method of manufacturing the same.

As one of the package structures for semiconductor devices, a Tape-BGA package-type semiconductor device (to be referred to as a BGA package hereinafter) is known.

For example, as shown in FIG. 8, this BGA package 1 has a semiconductor chip 2 and a TAB tape 3 having inner leads 4 to be connected to electrodes 2a of the semiconductor chip 2 by inner lead bonding.

A metal (e.g., a Cu alloy) stiffener 5 and a heat dissipation plate 6 formed of a metal plate member (e.g., a Cu alloy member) are stacked on the lower surface of the TAB tape 3. The stiffener 5 is formed into a frame to correct the warp of the TAB tape 3, thereby maintaining the flatness thereof. The heat dissipation plate 6 is called a heat spreader (H/SP) for dissipating heat generated by the semiconductor chip 2. In FIG. 8, a chip mounting portion 6a is formed at the center of the surface of the heat dissipation plate 6 having an entirely rectangular shape. The stiffener 5 forms a frame having an opening that surrounds the chip mounting portion 6a.

In the BGA package 1 described above, as shown in FIGS. 9 and 10, the inner leads 4 of the TAB tape 3 are bonded to the electrodes 2a of the semiconductor chip 2, and the stiffener 5 is adhered to the lower surface of the TAB tape 3 with an adhesive 8 to maintain the flatness thereof. After that, the bonding portions of the electrodes 2a of the semiconductor chip 2 and the inner leads 4 are coated with a resin 9. Solder balls 10 are formed at portions of the surface of the TAB tape 3 described above which correspond to the respective leads.

The heat dissipation plate 6 is set to oppose the lower surfaces of the semiconductor chip 2 and stiffener 5. The semiconductor chip 2 and stiffener 5 are pressed against the heat dissipation plate 6 through a conductive paste 11 such as Ag paste and an adhesive 12, respectively, so that the semiconductor chip 2, stiffener 5, and heat dissipation plate 6 are integrally adhered to each other.

In the conventional BGA package 1 described above, since the frame-like stiffener 5 is formed of a metal plate material made of a Cu alloy or the like, the weight of the whole package increases, and demands for a smaller size and smaller weight cannot be satisfied. If such a BGA package 1 is relatively heavy, when the solder balls (solder bumps) 10 are fused when packaging the BGA package 1, they cannot withstand the weight of the BGA package 1 but are crushed flat to form bridges connected to the adjacent solder balls 10. If the BGA package 1 is heavy, a bonding strength that can withstand a drop impact test for the package cannot be obtained in design.

In the conventional BGA package 1 described above, since the heat dissipation plate 6 and stiffener 5 are formed of metal plate members, the package weight increases, as described above. In addition, the material cost per product increases.

In the BGA package 1 having the above structure, after the stiffener 5 and TAB tape 3 are adhered to each other with the adhesive 8, the semiconductor chip 2 and stiffener 5 are adhered to the heat dissipation plate 6 with the conductive paste 11 and adhesive 12, respectively, resulting in the two adhering steps. As these separate adhering steps are required, the manufacturing process becomes complicated, and the production efficiency is poor.

When the stiffener 5 and heat dissipation plate 6 are fixed to each other by adhesion in this manner, the precision may be degraded due to a positional shift occurring during adhesion. Also, the adhering steps described above take a long hardening time until the adhesives harden, degrading the productivity.

In the BGA package 1 described above, the metal stiffener 5 is adhered to the TAB tape 3. As an excessively large difference is present in thermal expansion between the stiffener 5 and TAB tape 3, during the manufacture or during mounting this package onto a printed circuit board, a stress remains between the solder balls 10 and the mounting board. Then, the long-term reliability decreases.

SUMMARY OF THE INVENTION

The present invention has been made in view of the above situations, and has as its object to provide a semiconductor device in which downsizing and weight reduction of the whole package are achieved, the manufacturing cost including the material cost is decreased, and the manufacturing process is simplified to improve the production efficiency, and a method of manufacturing the same.

In order to achieve the above object, according to the present invention, there is provided a semiconductor device comprising a semiconductor chip, a TAB tape having leads to be connected to electrodes of the semiconductor chip, a stiffener adhered to a lower surface of the TAB tape to maintain flatness of the TAB tape, and a heat dissipation plate having a surface on which the semiconductor chip and the stiffener surrounding the semiconductor chip are adhered to dissipate heat generated by semiconductor chip, wherein the stiffener is molded with a synthetic resin material.

DESCRIPTION OF THE PREFERRED EMBODIMENTS

Figure 1:
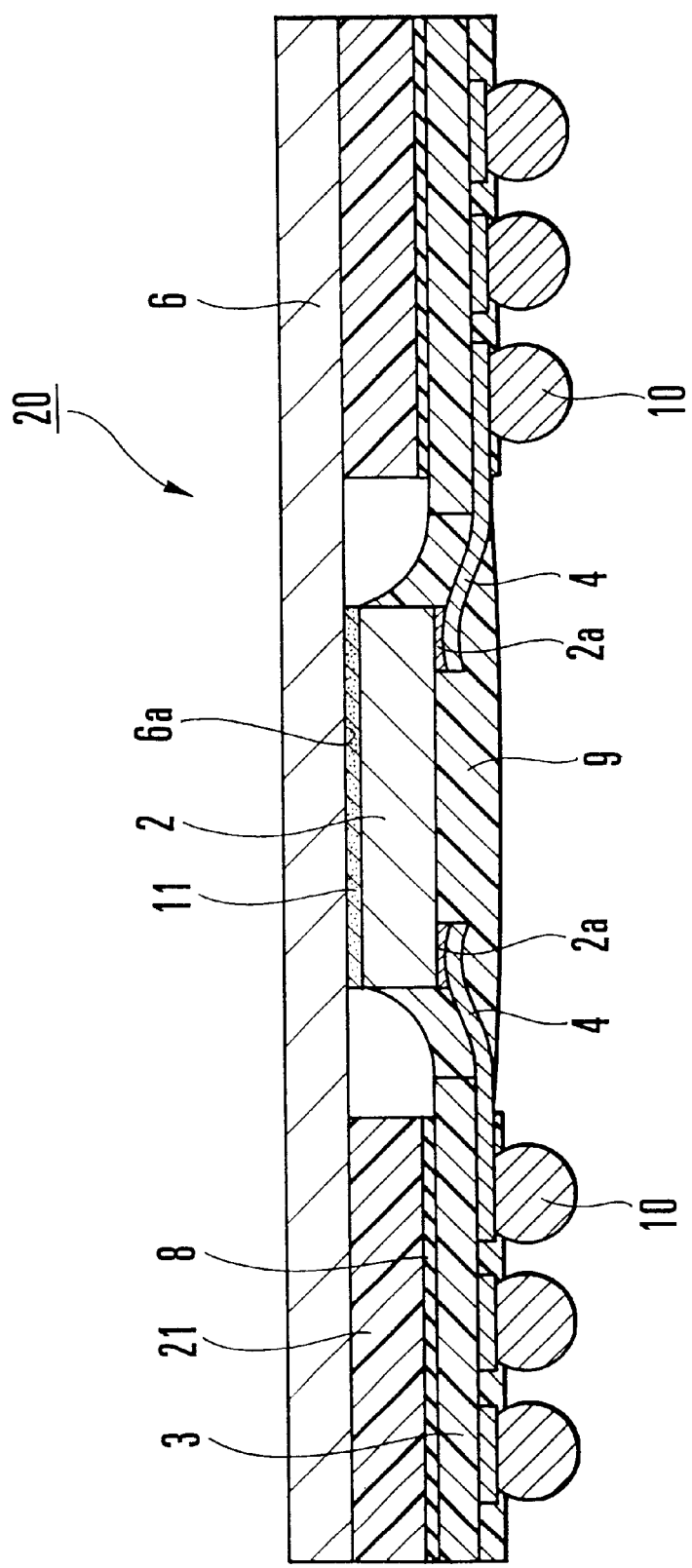
FIG. 1 is a sectional view showing the main part of a semiconductor device according to an embodiment of the present invention.
Figures 2A, 2B, 2C, 2D, 2E, 2F:
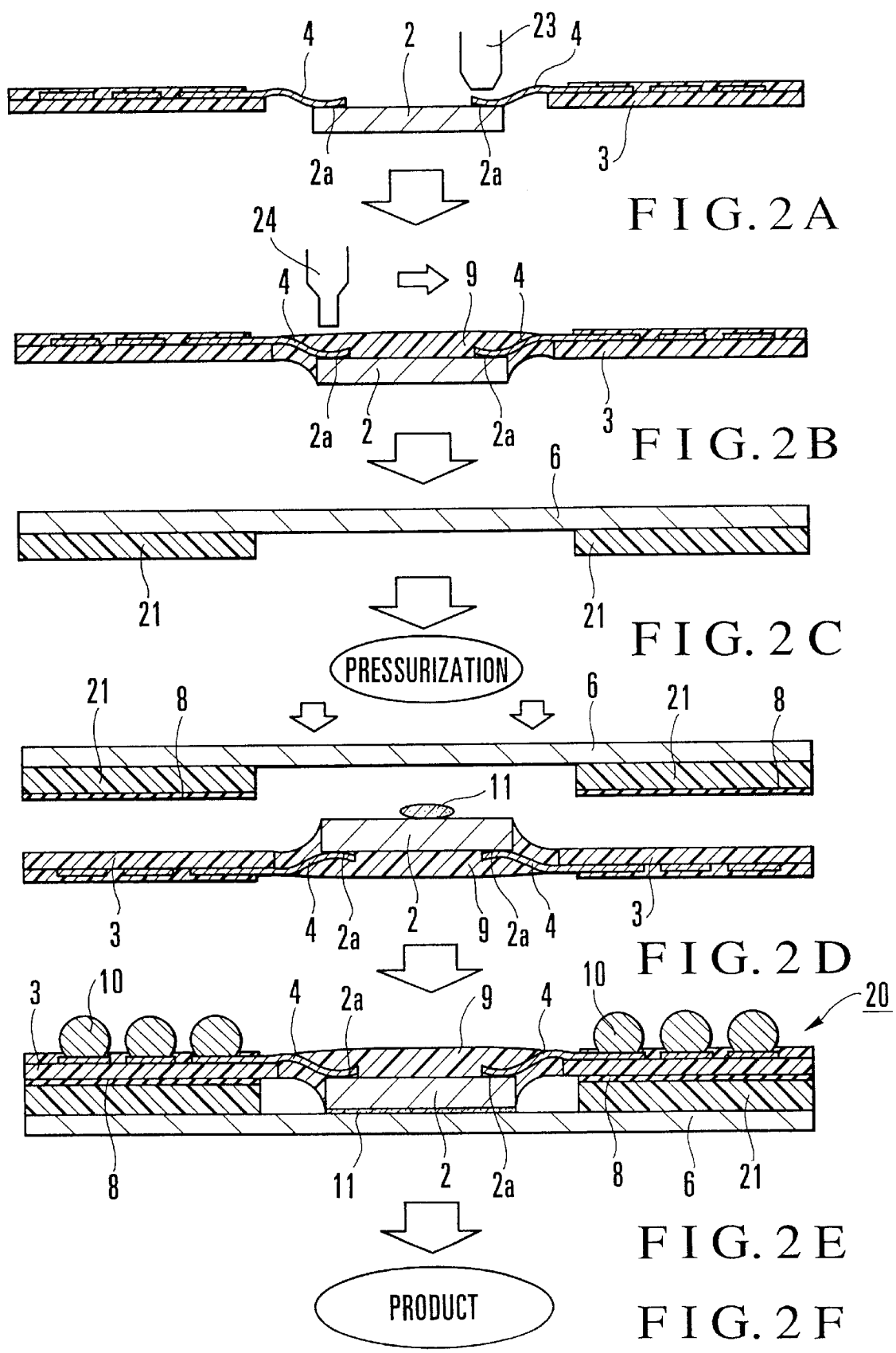
FIGS. 2A to 2F are views showing the steps in a method of manufacturing a semiconductor device according to an embodiment of the present invention.
Figure 3:
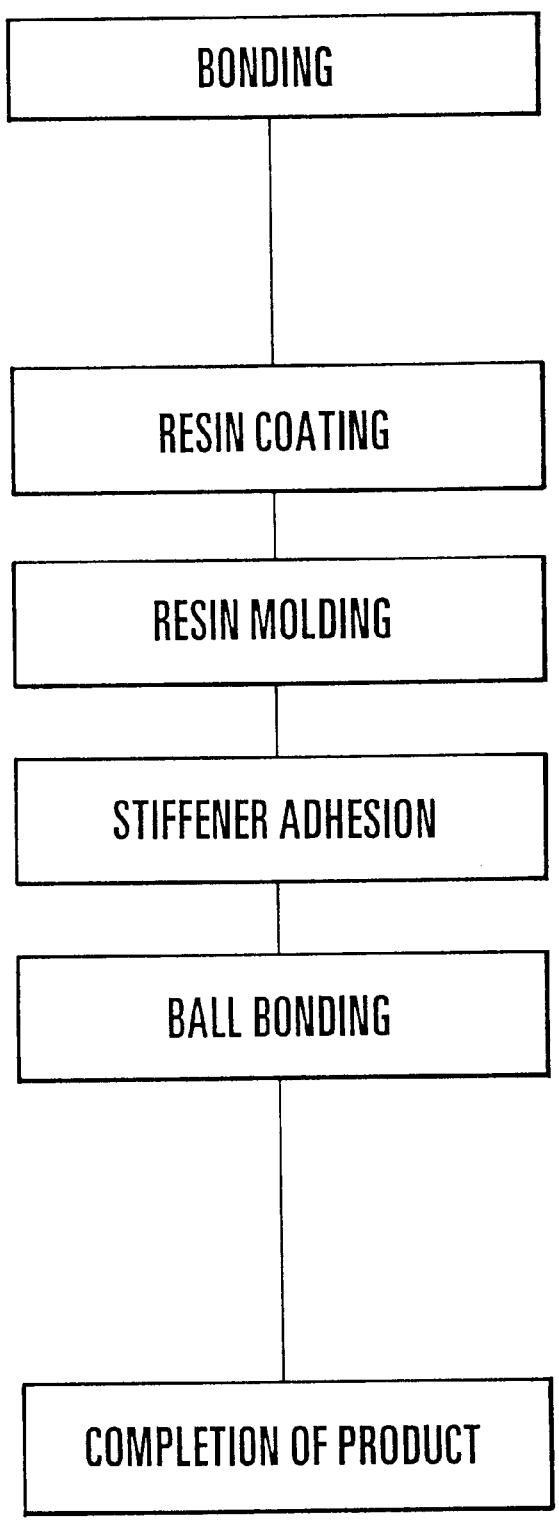
FIG. 3 is a flow chart explaining the manufacturing process of the method of manufacturing a semiconductor device according to the present invention.
Figure 8:
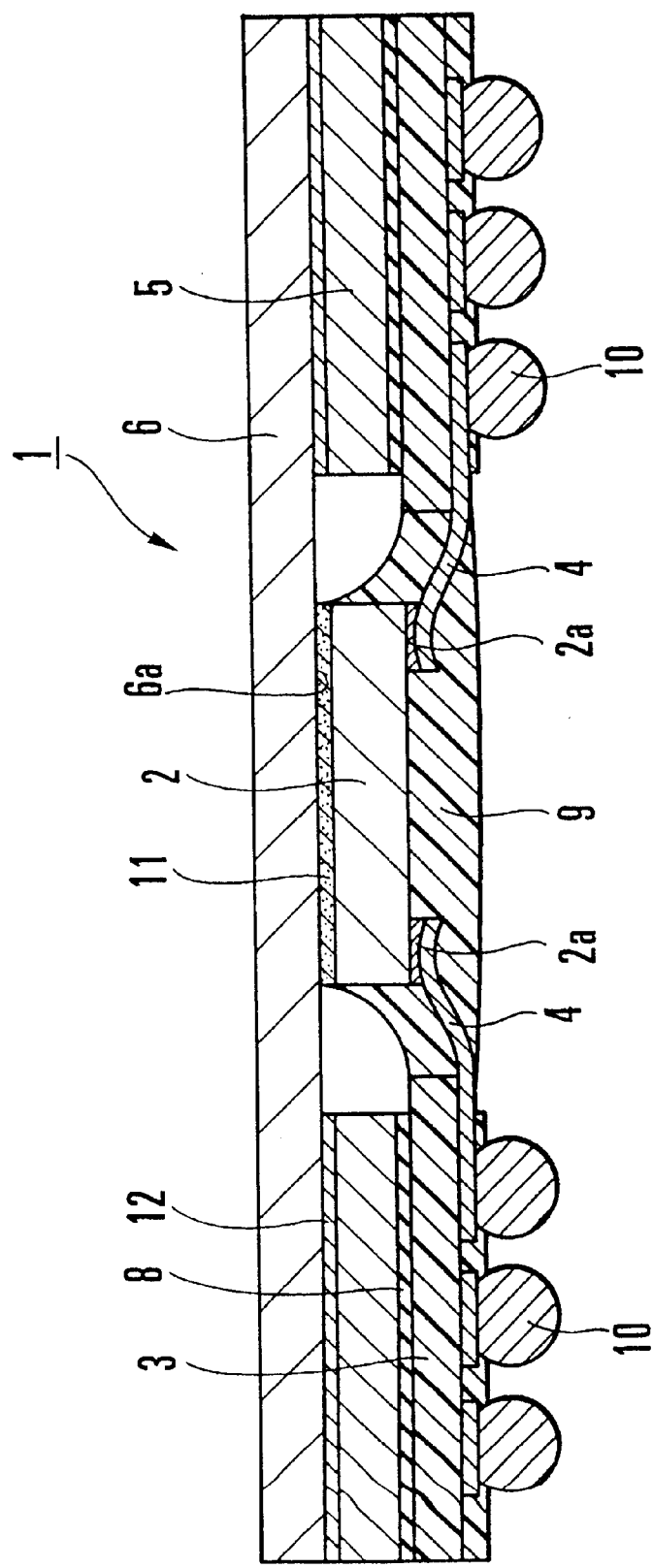
FIG. 8 is a sectional view showing the main part of an example of a conventional semiconductor device.
Figure 9:
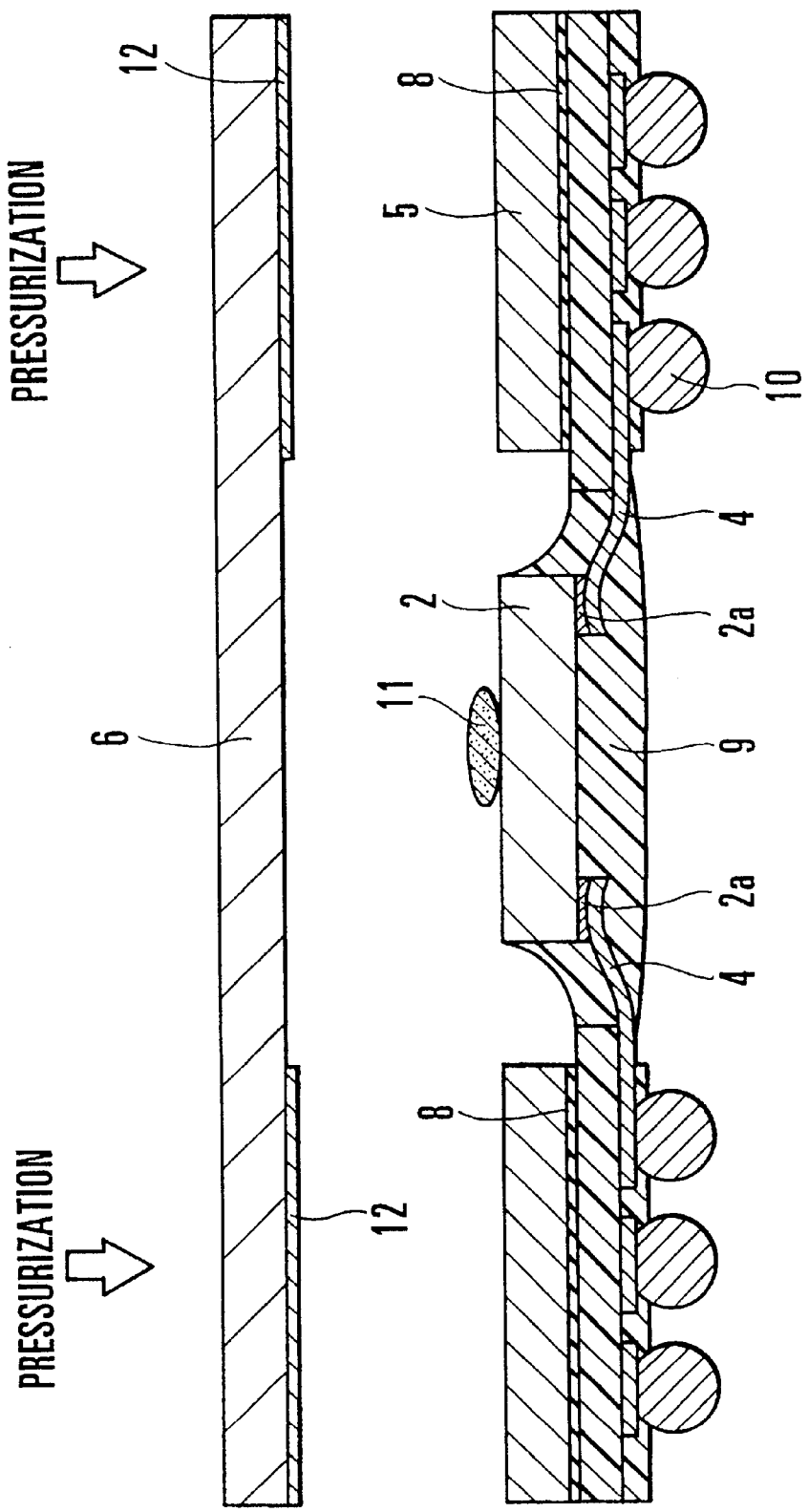
FIG. 9 is a partial process view for explaining a conventional method of manufacturing a semiconductor device.
Figure 10:
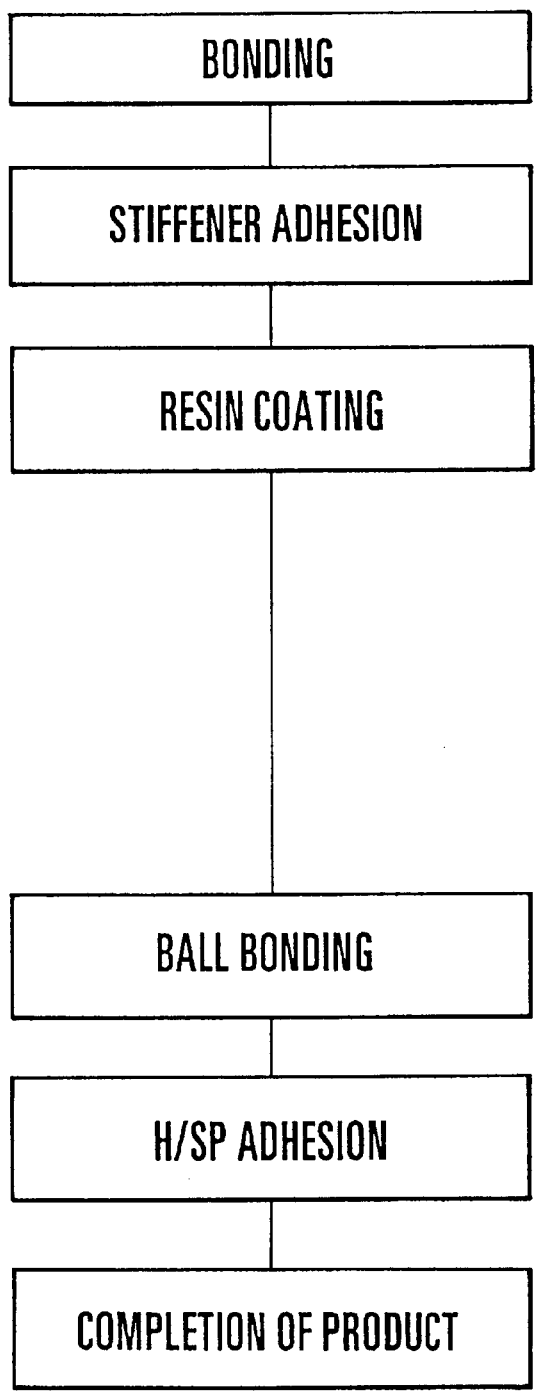
FIG. 10 is a flow chart explaining the steps in the conventional method of manufacturing a semiconductor device.

FIGS. 1 to 3 show a semiconductor device and a method of manufacturing the same according to an embodiment of the present invention. In FIGS. 1 to 3, portions identical or corresponding to those of FIGS. 8 to 10 described above are denoted by the same reference numerals, and a detailed description thereof will be omitted as required.

A Tape-BGA package-type semiconductor device 20 (to be referred to as a BGA package hereinafter) of this embodiment uses, in place of a stiffener conventionally formed of a metal material such as a Cu alloy, a stiffener 21 formed of a filler-containing synthetic resin material such as a filler-containing thermosetting resin material by resin molding in accordance with a transfer method.

When this resin stiffener 21 is formed by using a comparatively inexpensive epoxy-based resin, the material cost can be greatly decreased, and the manufacturing cost of the BGA package 20 can be decreased.

As the filler-containing thermosetting resin described above, if one obtained by adding 70 wt % to 80 wt % of a filler ($SiO_2$) to a biphenyl-based epoxy-based resin is used, a coefficient of linear expansion of 17 ppm, which is equal to that of the Cu alloy material of the heat dissipation plate 6, can be obtained. Hence, the distortion (warp) caused by shrinkage upon hardening or the like can be eliminated.

In this embodiment, the resin stiffener 21 is formed by integrally bonding it to a heat dissipation plate 6, identical to that described above, by insert molding. Hence, the stiffener 21 and heat dissipation plate 6 can form an integral structure.

Figure 5:
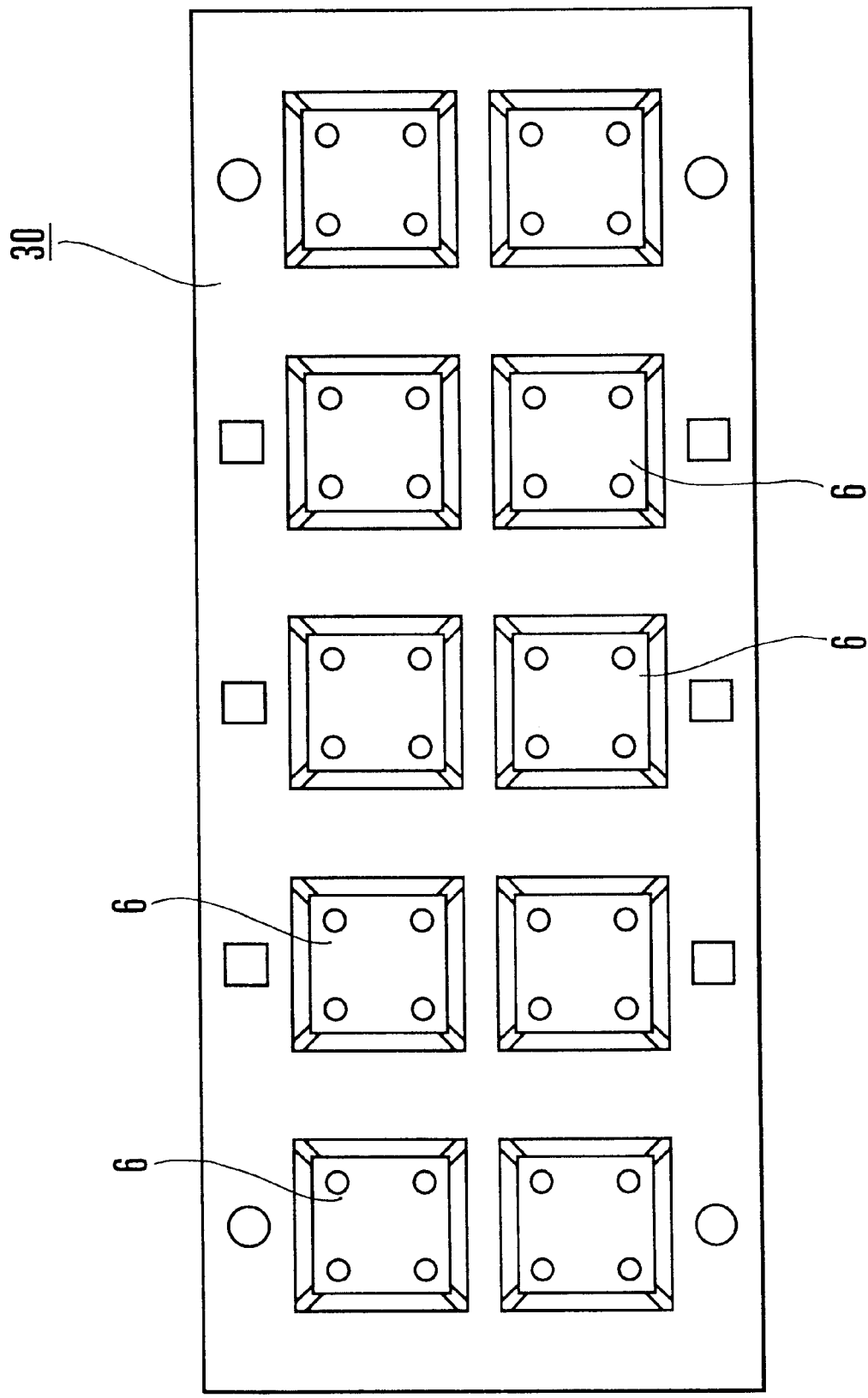
FIG. 5 is a plan view showing an example of a lead frame-type heat dissipation plate used in the method of manufacturing a semiconductor device according to the present invention.

As the heat dissipation plate 6 of this case, a lead frame-type heat dissipation plate having a large number of heat dissipation plate units, as shown in FIG. 5, may be preferably employed. When such a lead frame-type heat dissipation plate 30 is employed, the facilities of the semiconductor manufacturing apparatus an be shared.

The BGA package 20 using this resin stiffener 21 is manufactured in the following manner.

In the bonding step shown in FIG. 2A, electrodes 2*a* of a semiconductor chip 2 and inner leads 4 of a TAB tape 3 are bonded to each other. Reference numeral 23 denotes a bonding tool.

In the resin coating step shown in FIG. 2B, the bonding portions of the electrodes 2*a* and inner leads 4 are coated with a resin. Reference numeral 24 denotes a resin coating tool.

In the resin molding step shown in FIG. 2C, the stiffener 21 for maintaining the flatness of the TAB tape 3 is molded with a filler-containing synthetic resin material such as a filler-containing thermosetting resin. The resin stiffener 21 is integrally fixed to the heat dissipation plate 6, excluding a chip mounting portion 6*a* at the center of its surface, that dissipates heat generated by the semiconductor chip 2.

The resin stiffener 21 and heat dissipation plate 6 may be integrally bonded and fixed to each other by insert-molding the resin stiffener 21 by using the heat dissipation plate 6 as an insert.

This makes the conventionally necessary adhesive and adhering steps unnecessary, to shorten the process time during the manufacture. The present invention is not limited to this. Alternatively, after resin molding, the resin stiffener 21 may be adhered to the heat dissipation plate 6, to form an integral structure of the resin stiffener 21 and heat dissipation late 6.

In the stiffener adhering step shown in FIG. 2D, the resin stiffener 21 integrally formed on the heat dissipation plate 6 is adhered to the lower surface of the TAB tape 3 through an adhesive 8 under pressure. At this time, the lower surface of the semiconductor chip 2 is set to oppose the chip mounting portion 6*a* of the heat dissipation plate 6. The opposing portions of the chip mounting portion 6*a* and the lower surface of the semiconductor chip 2 are adhered to each other simultaneously through a conductive paste 11.

Figure 4:
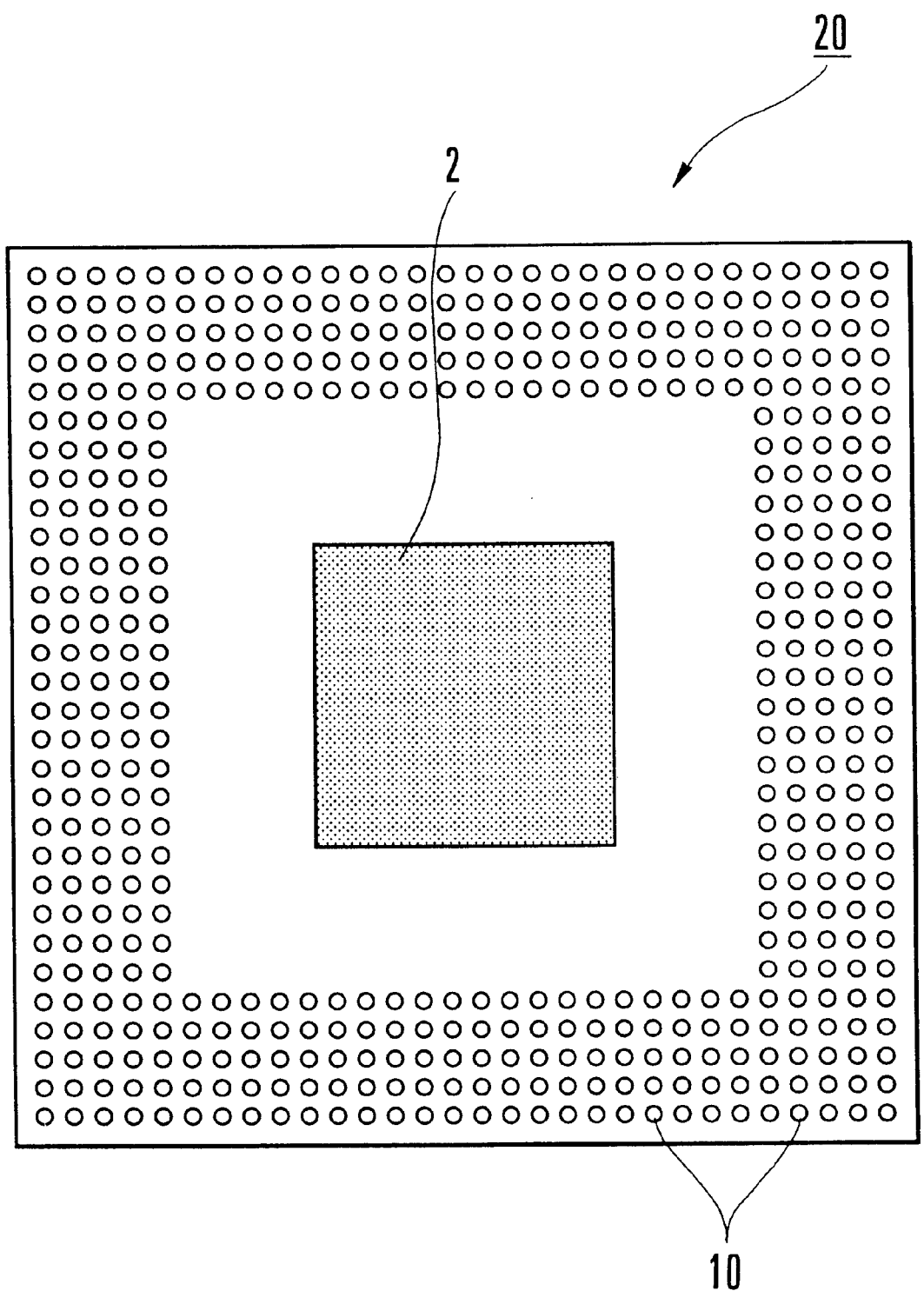
FIG. 4 is a plan view showing an example of a TAB tape used for the semiconductor device according to the present invention.

After that, in the ball adhering step shown in FIG. 2E, solder balls 10 are aligned at positions on the surface of the TAB tape 3 described above that correspond to the respective leads, as shown in FIG. 4, thus completing the product in FIG. 2F.

FIG. 3 shows the manufacturing process for this BGA package 20. This manufacturing process is different from the conventional manufacturing process shown in FIG. 10 in the order of the stiffener adhering step and the absence of the adhering step for the heat dissipation plate 6 (H/SP).

In the embodiment of the structure and the manufacturing method described above, the stiffener 21 is molded with a filler-containing synthetic resin material such as a filler-containing thermosetting resin, in place of the conventional metal plate member, and is integrally bonded to the heat dissipation plate 6, so that a conventionally required adhering step can be omitted. In particular, when the heat dissipation plate 6 is inserted during resin molding of the stiffener 21, the adhering step for the resin stiffener 21 and heat dissipation plate 6 becomes unnecessary.

According to the BGA package 20 having the above arrangement, the resin stiffener 21 is formed by resin molding in accordance with the transfer method, so that a stiffener 21 having an opening size matching the chip size can be formed and supplied at a low cost.

Conventionally, the TAB tape 3 is fixed to the metal stiffener by applying an adhesive to the metal stiffener. In contrast to this, according to the BGA package 20 described above, the base film (polyimide) of the TAB tape 3 is made of a thermoplastic polyimide tape that can obtain adhesion by heating. Thus, the adhesive can be eliminated.

If the BGA package 20 has a length of 27 mm or less, the heat dissipation plate 30 shown in FIG. 5 can be formed as a matrix (two arrays). An improvement in the production efficiency of the package can thus be expected.

According to the BGA package 20 having the above arrangement, its weight can be greatly reduced. Conventionally, since the stiffener is formed of a metal plate, the solder balls 10 form bridges connected to the adjacent balls during packaging due to the weight of the package, posing a problem. However, this inconvenience can be solved. In the lightweight package 20, the removal of the semiconductor chip does not occur in the drop impact test. Therefore, the required bonding strengths can be ensured at the respective portions of the package 20.

In the BGA package 20, the material of the stiffener 21 is replaced and an adhesive for bonding the stiffener 21 and heat dissipation plate 6 to each other is unnecessary. The material cost can accordingly be decreased, and the productivity can be further increased.

Figure 6:
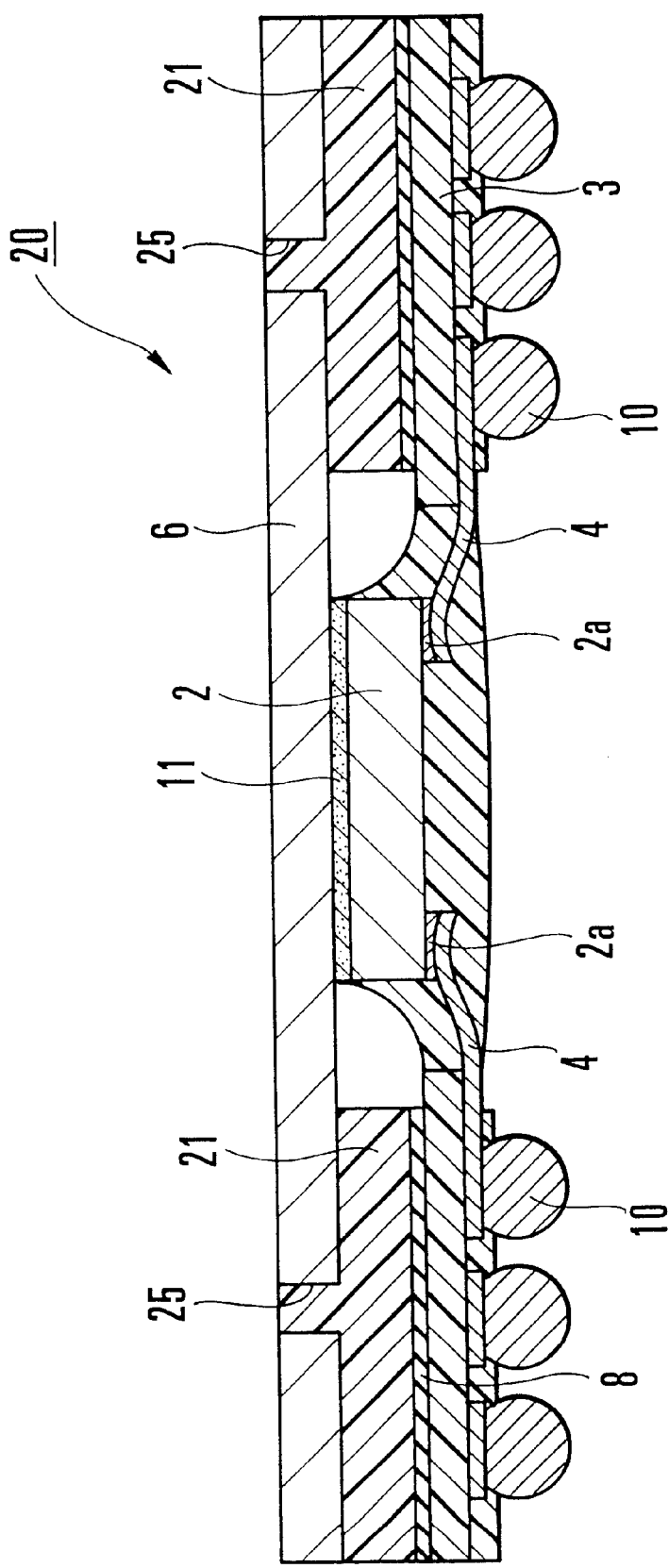
FIG. 6 is a sectional view showing the main part of a semiconductor device according to another embodiment of the present invention.

FIGS. 6 and 7 show a semiconductor device and a method of manufacturing the same according to another embodiment of the present invention.

In this embodiment, when forming a resin stiffener 21 in accordance with resin molding by inserting a heat dissipation plate 6, a plurality of resin filling holes 25 are formed at appropriate positions of the heat dissipation plate 6.

When resin-molding the stiffener 21, a resin material is filled in the resin filling holes 25 and is hardened, so that the bonding strength of the resin stiffener 21 with respect to the heat dissipation plate can be further ensured.

Figure 7A:
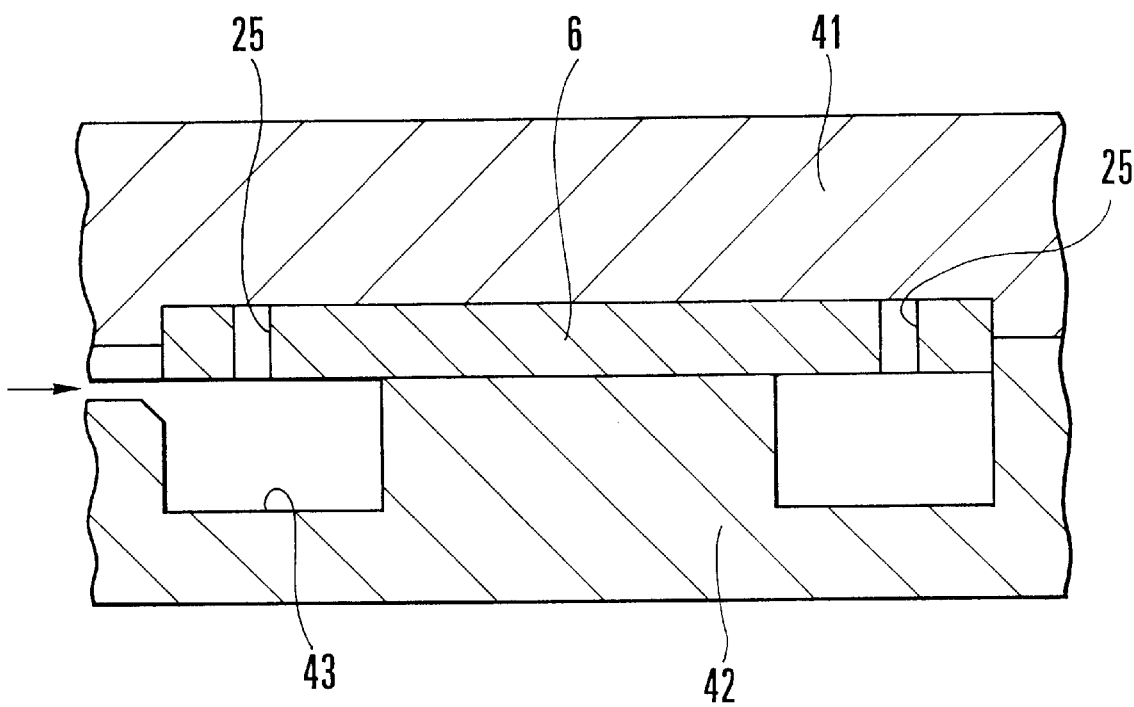
FIGS. 7A and 7B are views showing a method of manufacturing a semiconductor device according to another embodiment of the present invention, to indicates states in resin molding of a resin stiffener.
Figure 7B:
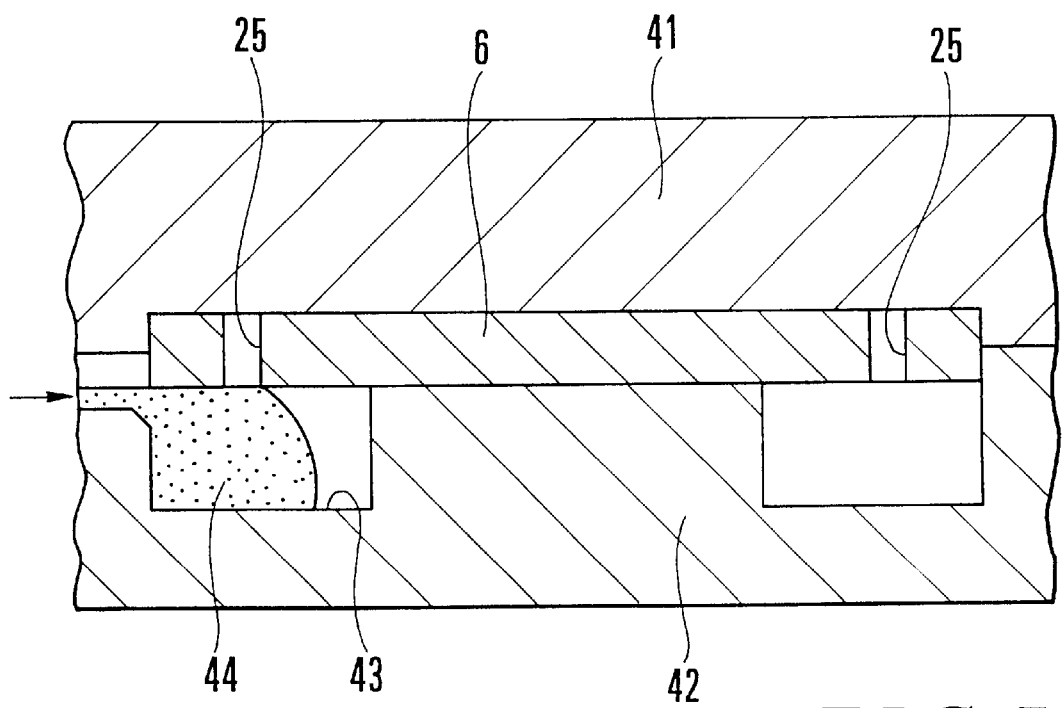

In FIGS. 7A and 7B, reference numerals 41 and 42 denote molds; 43, a cavity for molding the stiffener 21; and 44, a resin material for molding.

The present invention is not limited to the structures described in the embodiments described above, but the shapes, structures, and the like of the respective portions can be changed and modified, as a matter of course. For example, the practical structure and the like of the BGA package 20 can be freely changed and modified to conventionally widely-known structures as required.

The resin molding material of the resin stiffener 21 is not limited to a biphenyl-based epoxy-based described in the embodiments described above, but may be changed as required.

As has been described above, according to the semiconductor device and the method of manufacturing the same according to the present invention, the stiffener, which is conventionally made of a metal, is molded with a filler-containing thermosetting resin. This greatly decreases the weight of the whole package.

This resin stiffener can reduce not only the number of assembling steps and the number of components of the whole package, but also the weight of the whole package. This solves an inconvenience in which the solder balls form bridges connected to the adjacent balls during packaging. In such a lightweight package, the removal of the semiconductor chip does not occur in the drop impact test. Therefore, the required bonding strengths can be ensured at the respective portions of the package.

According to the present invention, since molding of the stiffener from a synthetic resin material and an adhesive that bonds the stiffener and the heat radiation plate to each other are unnecessary, the material cost can be decreased, and the productivity can be further improved.

What is claimed is:

1. A semiconductor device comprising:
   a semiconductor chip;
   a TAB tape having leads to be connected to electrodes of said semiconductor
   a stiffener adhered to a lower surface of said TAB tape to maintain flatness of said TAB tape; and
   a metallic heat dissipation plate having a surface on which said semiconductor chip and said stiffener surrounding said semiconductor chip are adhered to dissipate heat generated by said semiconductor chip,
   wherein said stiffener is molded of a synthetic resin material having a coefficient of linear expansion equal to that of said metallic heat dissipation plate.

2. A device according to claim 1, wherein said stiffener (21) is made of a filler-containing thermosetting resin.

3. A device according to claim 2, wherein said filler-containing thermosetting resin comprises a silicon oxide-filled biphenyl-based epoxy-based resin.

4. A device according to claim 3, wherein said filler-containing thermosetting resin comprises 70–80 weight % of filler.

5. A device according to claim 1, wherein
   said heat dissipation plate (6) has a resin filling hole, and
   said stiffener (21) and said heat dissipation plate (6) are formed by insert molding.

6. A device according to claim 1, wherein said metallic heat dissipation plate comprises copper.

7. A device according to claim 1, wherein said synthetic resin material comprises a biphenyl-based epoxy-based resin.

* * * * *